(12) United States Patent
Kim (10) Patent No.: US 10,854,685 B2
(45) Date of Patent: Dec. 1, 2020

(54) ELECTROLUMINESCENT DISPLAY DEVICE (71) Applicant: LG Display Co., Ltd., Seoul (KR)

(72) Inventor: Kanghyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/562,061

(22) Filed: Sep. 5, 2019

(65) Prior Publication Data
US 2019/0393276 A1 Dec. 26, 2019

Related U.S. Application Data (63) Continuation of application No. 15/816,398, filed on Nov. 17, 2017, now Pat. No. 10,446,619.

(30) Foreign Application Priority Data

Dec. 28, 2016 (KR) .................. 10-2016-0181383

(51) Int. Cl.
H01L 27/32 (2006.01)
H01L 51/50 (2006.01)
H01L 51/52 (2006.01)

(52) U.S. Cl.
CPC ...... *H01L 27/3218* (2013.01); *H01L 27/3216* (2013.01); *H01L 27/3246* (2013.01); (Continued)

(58) Field of Classification Search
CPC . H01L 27/3218; H01L 27/32; H01L 27/3216; H01L 27/3246; H01L 51/50; (Continued)

(56) References Cited

U.S. PATENT DOCUMENTS

2005/0087740 A1  4/2005 Matsumoto et al.
2011/0260952 A1  10/2011 Hwang et al.
(Continued)

FOREIGN PATENT DOCUMENTS

JP  2005-100724 A  4/2005
JP  2005-310713 A  11/2005
(Continued)

OTHER PUBLICATIONS

European Patent Office, Extended European Search Report and Opinion, EP Patent Application No. 17205965.1, dated May 30, 2018, ten pages.
(Continued)

*Primary Examiner* — Fazli Erdem
(74) *Attorney, Agent, or Firm* — Fenwick & West LLP (57) ABSTRACT Disclosed is an electroluminescent display device that may include a plurality of pixels arranged in first and second directions, first, second, and third sub pixels provided in each of the plurality of pixels and arranged in the first direction, a first emission layer provided to correspond to at least two of the first sub pixels arranged in the second direction, a second emission layer provided to correspond to at least two of the second sub pixels arranged in the second direction, and a third emission layer provided to correspond to at least two of the third sub pixels arranged in the second direction, wherein the first emission layer, the second emission layer, and the third emission layer are spaced from one another and provided to emit different types of light.

25 Claims, 3 Drawing Sheets (52) U.S. Cl.
CPC ...... *H01L 51/5012* (2013.01); *H01L 51/5206* (2013.01); *H01L 51/5225* (2013.01)

(58) Field of Classification Search
CPC . H01L 51/52; H01L 51/5012; H01L 51/5206; H01L 51/5225
USPC ......................................................... 257/89
See application file for complete search history.

(56) References Cited

U.S. PATENT DOCUMENTS

| | | |
|---|---|---|
| 2014/0197385 A1 | 7/2014 | Madigan |
| 2015/0009104 A1 | 1/2015 | Kim et al. |
| 2015/0212367 A1 | 7/2015 | Wang et al. |
| 2016/0071913 A1 | 3/2016 | Kim et al. |
| 2016/0322433 A1 | 11/2016 | Kim et al. |
| 2016/0343282 A1 | 11/2016 | Wang et al. |
| 2017/0004751 A1 | 1/2017 | Seo et al. |
| 2017/0125490 A1 | 5/2017 | Li et al. |
| 2017/0301740 A1 | 10/2017 | Goto et al. |
| 2018/0158883 A1 | 6/2018 | Zhang et al. |
| 2018/0166510 A1* | 6/2018 | Lee ..................... H01L 27/3218 |
| 2018/0190736 A1 | 7/2018 | Kim |

FOREIGN PATENT DOCUMENTS

| | | |
|---|---|---|
| JP | 2008-091070 A | 4/2008 |
| WO | WO 2016/0047144 A1 | 3/2016 |

OTHER PUBLICATIONS

Japan Patent Office, Office Action, JP Patent Application No. 2017-250308, dated Nov. 29, 2018, five pages (with concise explanation of relevance).
United States Office Action, U.S. Appl. No. 15/816,398, dated Mar. 25, 2019, seven pages.
United States Office Action, U.S. Appl. No. 15/816,398, dated Dec. 21, 2018, 16 pages.
United States Office Action, U.S. Appl. No. 15/816,398, dated Oct. 2, 2018, 16 pages.
United States Office Action, U.S. Appl. No. 15/816,398, dated Apr. 26, 2018, 13 pages.

* cited by examiner

ELECTROLUMINESCENT DISPLAY DEVICE

CROSS REFERENCE TO RELATED APPLICATIONS

This application is a continuation of U.S. patent application Ser. No. 15/816,398 filed on Nov. 17, 2017 which claims the benefit of the Korean Patent Application No. 10-2016-0181383 filed on Dec. 28, 2016, each of which is hereby incorporated by reference as if fully set forth herein.

BACKGROUND

Field of the Disclosure

Embodiments of the present invention relate to an electroluminescent display device, and more particularly, to an electroluminescent display device manufactured by a solution process.

Discussion of the Related Art

An electroluminescent display device is provided in such way that an emission layer is formed between two electrodes. According as the emission layer emits light by an electric field between the two electrodes, an image is displayed on the electroluminescent display device.

The emission layer may be formed of an organic material which emits light when exciton is produced by a recombination of electron and hole, and the exciton falls to a ground state from an excited state. Alternatively, the emission layer may be formed of an inorganic material such as quantum dots.

Hereinafter, a related art electroluminescent display device will be described with reference to the accompanying drawings.

Figure 1A:
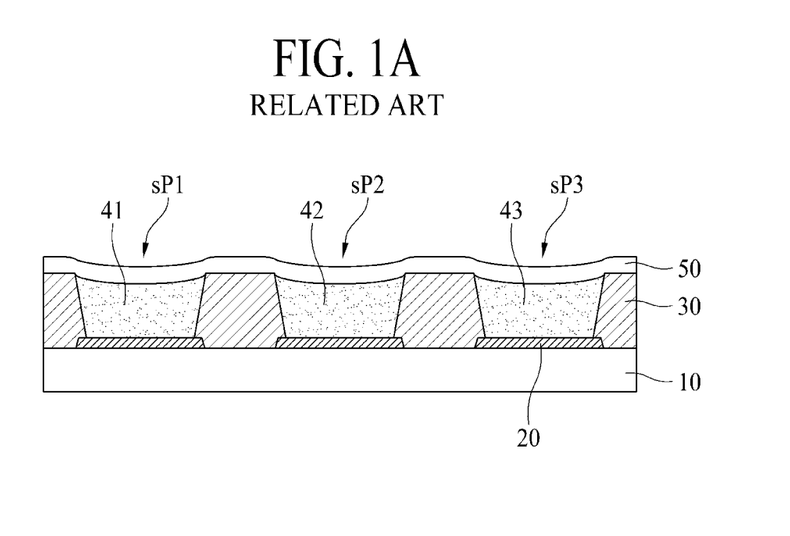
FIG. 1A is a cross sectional view illustrating a related art electroluminescent display device.
Figure 1B:
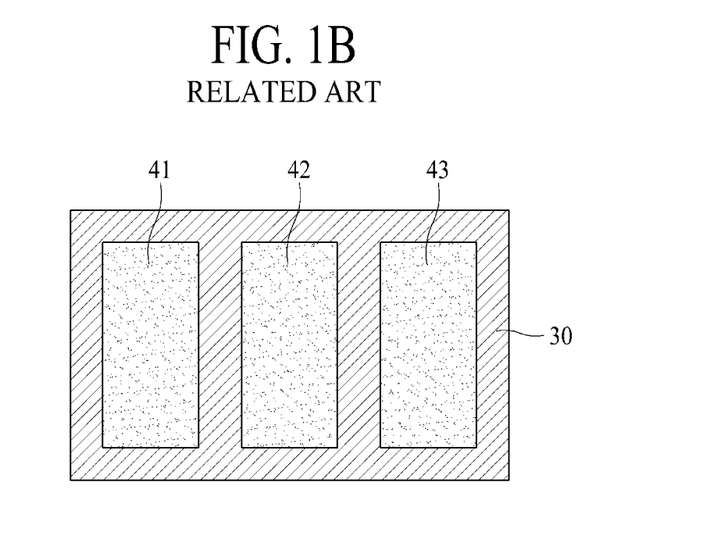
FIG. 1B is a plane view illustrating the related art electroluminescent display device.

FIG. 1A is a cross sectional view illustrating a related art electroluminescent display device, and FIG. 1B is a plane view illustrating the related art electroluminescent display device.

As shown in FIG. 1A, the related art electroluminescent display device may include a substrate 10, a first electrode 20, a bank layer 30, emission layers 41, 42, and 43, and a second electrode 50.

The first electrode 20 is provided on the substrate 10. The first electrode 20 is patterned by each sub pixel (sP1, sP2, sP3).

The bank layer 30, which covers an end of the first electrode 20, is provided on the substrate 10. The bank layer 30 defines an area of the sub pixel (sP1, sP2, sP3).

The emission layers 41, 42, and 43 are provided on the first electrode 20. The emission layer 41, 42, and 43 are individually provided in the sub pixels (sP1, sP2, sP3). That is, the first emission layer 41 is provided in the first sub pixel (sP1), the second emission layer 42 is provided in the second sub pixel (sP2), and the third emission layer 43 is provided in the third sub pixel (sP3). Accordingly, one pixel is defined by a combination of the first sub pixel (sP1), the second sub pixel (sP2), and the third sub pixel (sP3).

The emission layers 41, 42, and 43 may be individually patterned for each sub pixel (sP1, sP2, sP3) by a vacuum deposition process using a predetermined mask. However, if the emission layers 41, 42, and 43 are patterned by the vacuum deposition process, it is necessary to use a high-priced vacuum deposition apparatus, thereby causing the increase of manufacturing cost. Especially, if manufacturing a large-sized electroluminescent display device, it inevitably causes the increase of manufacturing cost due to the increased size of mask and vacuum deposition apparatus, thereby lowering productivity for mass production. Accordingly, in order to reduce the manufacturing cost, a solution process using an inkjet apparatus has been proposed so as to form the emission layers 41, 42, and 43.

As shown in FIG. 1B, the first emission layer 41, the second emission layer 42, and the third emission layer 43 are patterned, and the bank layer 30 is provided between the adjoining emission layers 41, 42, and 43. In this case, the first emission layer 41, the second emission layer 42, and the third emission layer 43 are aligned at fixed intervals.

However, in case of the related art electroluminescent display device, it has limitations on resolution.

In order to realize high resolution in the electroluminescent display device, it is necessary to decrease a size of the pixel. As shown in FIG. 1B, when the plurality of sub pixels (sP1, sP2, sP3) are aligned, a size of each sub pixel (sP1, sP2, sP3) has to be decreased so as to realize the high-resolution electroluminescent display device.

However, if the sub pixel (sP1, sP2, sP3) is decreased in size, an area of the emission layer 41, 42, and 43 in each of the sub pixels (sP1, sP2, sP3) is also decreased in size.

In order to realize high resolution in the related art electroluminescent display device, it is necessary to decrease a size of each area in the emission layers 41, 42, and 43. To do this, it is necessary to reduce a size of a nozzle in the inkjet apparatus.

However, it has limitation of size reduction in the nozzle of the inject apparatus. If the small-sized area for each emission layer 41, 42, and 43 is formed by the use of inkjet apparatus, the emission layers 41, 42, and 43 may be mixed together without being clearly separated.

Accordingly, it is difficult to make the size of the area in each emission layer 41, 42, and 43 be less than a predetermined value, whereby it is also difficult to realize the high-resolution electroluminescent display device.

SUMMARY

Accordingly, embodiments of the present invention are directed to an electroluminescent display device that substantially obviates one or more problems due to limitations and disadvantages of the related art.

An aspect of embodiments of the present invention is directed to provide an electroluminescent display device capable of realizing high resolution, and preventing emission layers that should be separated from each other from being mixed together for a solution process.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an electroluminescent display device that may include a plurality of pixels arranged in a first direction and a second direction intersecting the first direction, first, second, and third sub pixels provided in each of the plurality of pixels and arranged in the first direction, a first emission layer provided to correspond to at least two of the first sub pixels arranged in the second direction, a second emission layer provided to correspond to at least two of the second sub pixels arranged in the second direction, and a third emission layer provided to correspond to at least two of the third sub pixels arranged in the second direction, wherein the first emission layer, the second emission layer, and the third emission layer are spaced from one another and provided to emit different colors of light.

In another aspect of an embodiment of the present invention, there is provided an electroluminescent display device that may include a first pixel including first, second, and third sub pixels arranged in a first direction, a second pixel including first, second, and third sub pixels arranged in the first direction, wherein the first and second pixels are disposed along a second direction while being spaced from each other in the second direction, a third pixel including first, second, and third sub pixels arranged in the first direction, wherein the second and third pixels are disposed along the second direction while being spaced from each other in the second direction, and an electrode provided in each of the plurality of first, second, and third sub pixels, wherein the second pixel is disposed between the first and third pixels, and a structure of the second pixel is different from those of the first pixel and the third pixel, the electrode provided in the first sub pixel of the second pixel is in a mirror-image relationship to the electrode provided in the first sub pixel of the first pixel, and to the electrode provided in the first sub pixel of the third pixel, the electrode provided in the second sub pixel of the second pixel is in a mirror-image relationship to the electrode provided in the second sub pixel of the first pixel, and to the electrode provided in the second sub pixel of the third pixel, and the electrode provided in the third sub pixel of the second pixel is in a mirror-image relationship to the electrode provided in the third sub pixel of the first pixel, and to the electrode provided in the third sub pixel of the third pixel.

In still another aspect of the present disclosure, an electroluminescent display device comprise a plurality of first electrodes arranged in a first direction and a second direction intersecting the first direction, each first electrode overlapping with a corresponding subpixel of a pixel among a plurality of pixels of the electroluminescent display device; a plurality of emission layers, one or more of the emission layers overlapping two or more subpixels of different pixels in the second direction of the electroluminescent display device; and a second electrode corresponding to the two or more subpixels of the different pixels of the electroluminescent display device. In one embodiment, the emission layers include a first emission layer configured to emit light of a first color and having a first shape; and a second emission layer configured to emit light of a second color and having a second shape. In another embodiment, the emission layers include a third emission layer configured to emit light of a third color and having the first shape.

In one embodiment, the pixels of the electroluminescent display device include a first pixel, a second pixel, and a third pixel arranged in the second direction. The first pixel includes a first subpixel, a second subpixel, and a third subpixel arranged in the first direction within the first pixel. The second pixel includes a first subpixel, a second subpixel, and a third subpixel arranged in the first direction within the second pixel. The third pixel includes a first subpixel, a second subpixel, and a third subpixel arranged in the first direction within the third pixel. A first emission layer is configured to emit light of a first color and overlaps the first subpixel of the first pixel and the first subpixel of the second pixel. A second emission layer is configured to emit light of a second color and overlaps the second subpixel of the second pixel and the second subpixel of the third pixel. A third emission layer is configured to emit light of a third color and overlaps the third subpixel of the first pixel and the third subpixel of the second pixel.

In one embodiment, the first subpixel of the first subpixel has a first triangle shape and the first subpixel of the second subpixel has a second triangle shape mirroring the first triangle shape along a boundary between the first subpixel of the first pixel and the first subpixel of the second pixel, the first emission layer having a diamond shape. The second subpixel of the second subpixel has the first triangle shape and the second subpixel of the third subpixel has the second triangle shape mirroring the first triangle shape along a boundary between the second subpixel of the second pixel and the second subpixel of the third pixel, the second emission layer having the diamond shape. The third subpixel of the first subpixel has a first parallelogram shape and the third subpixel of the second subpixel has a second parallelogram shape mirroring the first parallelogram shape along a boundary between the third subpixel of the first pixel and the third subpixel of the second pixel, the third emission layer having a joined parallelogram shape joining the first parallelogram shape and the second parallelogram shape.

In one embodiment, the electroluminescent display device may further comprise a bank layer including a first bank layer having hydrophilic properties and a second bank layer with an upper surface having hydrophobic properties. The second bank layer is disposed on the first bank layer. The first bank layer separates the first electrodes of each of the subpixels from one another, and the second bank layer separates each of the emission layers from one another.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an electroluminescent display device according to the embodiment of the present invention will be described with reference to the accompanying drawings.

Figure 2:
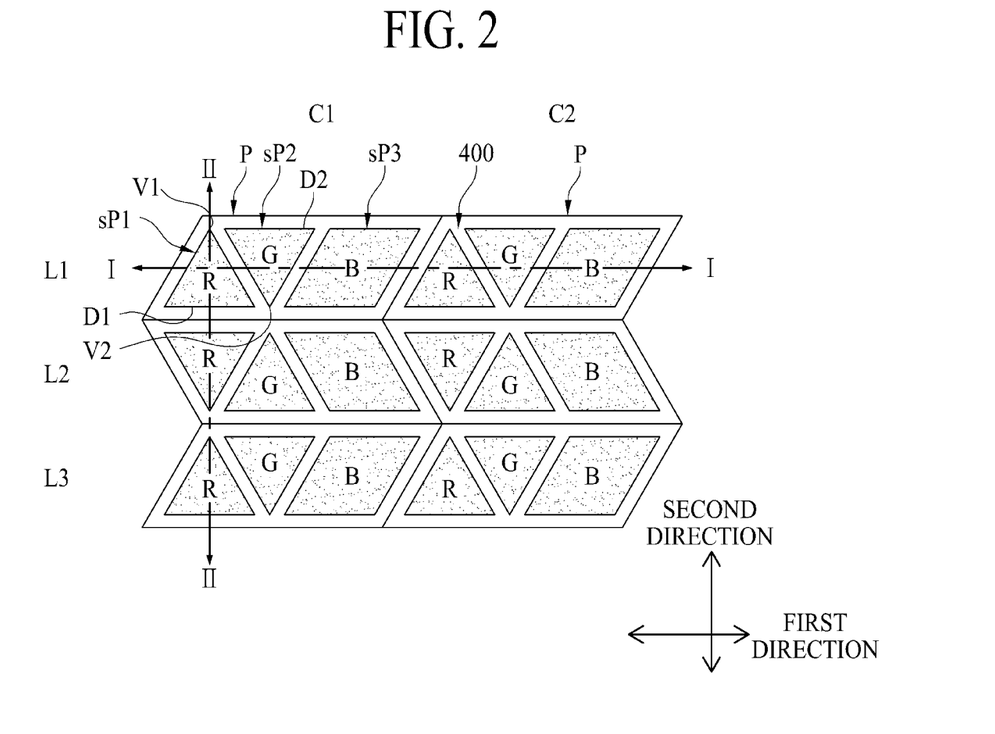
FIG. 2 is a plan view illustrating an electroluminescent display device according to one embodiment of the present invention.

FIG. 2 is a plane view illustrating an electroluminescent display device according to one embodiment of the present invention.

As shown in FIG. 2, the electroluminescent display device according to one embodiment of the present invention may include a plurality of pixels (P) arranged in a first direction, for example, a row direction, and arranged in a second direction, for example, a column direction.

Each of the plurality of pixels (P) may include a first sub pixel (sP1), a second sub pixel (sP2), and a third sub pixel (sP3). The first sub pixel (sP1), the second sub pixel (sP2), and the third sub pixel (sP3) are aligned in the first direction. That is, the second sub pixel (sP2) is disposed between the first sub pixel (sP1) and the third sub pixel (sP3).

In the drawings, the first sub pixel (sP1) is the sub pixel of emitting red light (R), the second sub pixel (sP2) is the sub pixel of emitting green light (G), and the third sub pixel (sP3) is the sub pixel of emitting blue light (B), but they are not limited to these structures.

A bank layer 400 is provided along the boundaries between each of the plurality of pixels (P), and between each of the plurality of sub pixels (sP1, sP2, sP3). Accordingly, an area of each of the sub pixels (sP1, sP2, sP3) and an area of each pixel (P) may be defined by the bank layer 400.

Each of the first sub pixel (sP1) and the second sub pixel (sP2) may be formed in a triangle structure. Especially, each of the first sub pixel (sP1) and the second sub pixel (sP2) may be formed in an isosceles triangle structure, but not limited to this structure.

In detail, one side (D1) of three sides of the first sub pixel (sP1) is parallel to a lower side of the pixel (P) while being adjacent to the lower side of the pixel (P), and one vertex (V1) being opposite to one side (D1) of the first sub pixel (sP1) is adjacent to an upper side of the pixel (P). Also, one side (D2) of three sides of the second sub pixel (sP2) is parallel to the upper side of the pixel (P) while being adjacent to the upper side of the pixel (P), and one vertex (V2) being opposite to one side (D2) of the second sub pixel (sP2) is adjacent to the lower side of the pixel (P).

The second sub pixel (sP2) is obtained by turning the first sub pixel (sP1) upside-down, that is, a shape of the second sub pixel (sP2) is obtained by downwardly reversing a shape of the first sub pixel (sP1). Even though the first sub pixel (sP1) and the second sub pixel (sP2) are provided in opposite arrangement structures, three sides and three internal angles in the first sub pixel (sP1) are identical to three sides and three internal angles in the second sub pixel (sP2), whereby the two triangles of the first sub pixel (sP1) and the second sub pixel (sP2) are congruent. Accordingly, if the first sub pixel (sP1) and the second sub pixel (sP2) are combined with each other, it may form a rectangular shape, and more particularly, a parallelogram shape.

The third sub pixel (sP3) is formed in a rectangular shape. Specifically, the third sub pixel (sP3) may be formed in a parallelogram shape. A size of the parallelogram shape of the third sub pixel (sP3) may be different from a size of the parallelogram shape obtained by combining the first sub pixel (sP1) and the second sub pixel (sP2) with each other, however, all internal angles in the parallelogram shape of the third sub pixel (sP3) are identical to all internal angles in the parallelogram shape obtained by combining the first sub pixel (sP1) and the second sub pixel (sP2) with each other. Accordingly, one pixel (P) obtained by combining the first sub pixel (sP1), the second sub pixel (sP2), and the third sub pixel (sP3) with one another is formed in a parallelogram shape. Eventually, the parallelogram shape of one pixel (P), the parallelogram shape of the third sub pixel (sP3), and the parallelogram shape obtained by combining the first sub pixel (sP1) and the second sub pixel (sP2) with each other have different sizes from one another, but have the same internal angles.

The plurality of pixels (P) arranged in the first direction are identical in structure. That is, the plurality of pixels (P) arranged in the same row (L1, L2, L3) may have the same structure. In other words, the sub pixels (sP1, sP2, sP3) in the plurality of pixels (P) arranged in the same row (L1, L2, L3) may have the same structure and arrangement.

However, the plurality of pixels (P) arranged in the second direction are not identical in structure. That is, the plurality of pixels (P) arranged in the same column (C1, C2) may have different structures. In other words, the sub pixels (sP1, sP2, sP3) in the plurality of pixels (P) arranged in the same column (C1, C2) may have the different structures and arrangements.

For example, the plurality of pixels (P) arranged in the odd-numbered rows, for example, the first row (L1) and the third row (L3) are identical in structure. However, the structure in the plurality of pixels (P) arranged in the odd-numbered row is different from the structure in the plurality of pixels (P) arranged in the even-numbered row such as the second row (L2). In detail, in case of the plurality of pixels (P) arranged in the odd-numbered row, one vertex (V) of the first sub pixel (sP1) is adjacent to the upper side of the pixel (P). Meanwhile, in case of the plurality of pixels (P) arranged in the even-numbered row, one vertex of the first sub pixel (sP1) is adjacent to the lower side of the pixel (P).

According to one embodiment of the present invention, the structure in the plurality of pixels (P) arranged in a first pixel group for the first row (L1) is identical to the structure in the plurality of pixels (P) arranged in a third pixel group for the third row (L3). However, the structure in the plurality of pixels (P) arranged in the first pixel group for the first row (L1) is different from the structure in the plurality of pixels (P) arranged in a second pixel group for the second row (L2). In this case, the plurality of pixels (P) in the same pixel group may have the same structure.

Also, the structure in the plurality of pixels (P) for the second pixel group is provided in a mirror-image relationship to the structure in the plurality of pixels (P) for the first pixel group, and to the structure in the plurality of pixels (P) for the third pixel group.

For example, one vertex (V) of the first sub pixel (sP1) in the first and third pixel groups is adjacent to the upper side of the pixel (P), and one vertex of the first sub pixel (sP1) in the second pixel group is adjacent to the lower side of the pixel (P), whereby the first sub pixel (sP1) in the first and third pixel groups is provided in an mirror-image relationship to the first sub pixel (sP1) of the second pixel group. Similarly, the second and third sub pixels (sP2, sP3) in the first and third pixel groups is provided in an mirror-image relationship to the second and third sub pixels (sP2, sP3) in the second pixel group.

According to one embodiment of the present invention, the same sub pixels (sP1, sP2, sP3) are arranged in the second direction, for example, the column direction. That is, the sub pixels (sP1, sP2, sP3) in the plurality of pixels (P) are arranged in the same order, whereby the same sub pixels (sP1, sP2, sP3) are aligned in the second direction. In other words, the plurality of first sub pixels (sP1) may be aligned in a line in the second direction, the plurality of second sub pixels (sP2) may be aligned in a line in the second direction, and the plurality of third sub pixels (sP3) are aligned in a line in the second direction.

According to one embodiment of the present invention, the first sub pixel (sP1) and the second sub pixel (sP2) are formed in the triangle shape, and the same sub pixels (sP1, sP2, sP3) are aligned in the second direction, whereby it facilitates to form an emission layer, which will be described with reference to FIGS. 3 and 4.

Figure 3:
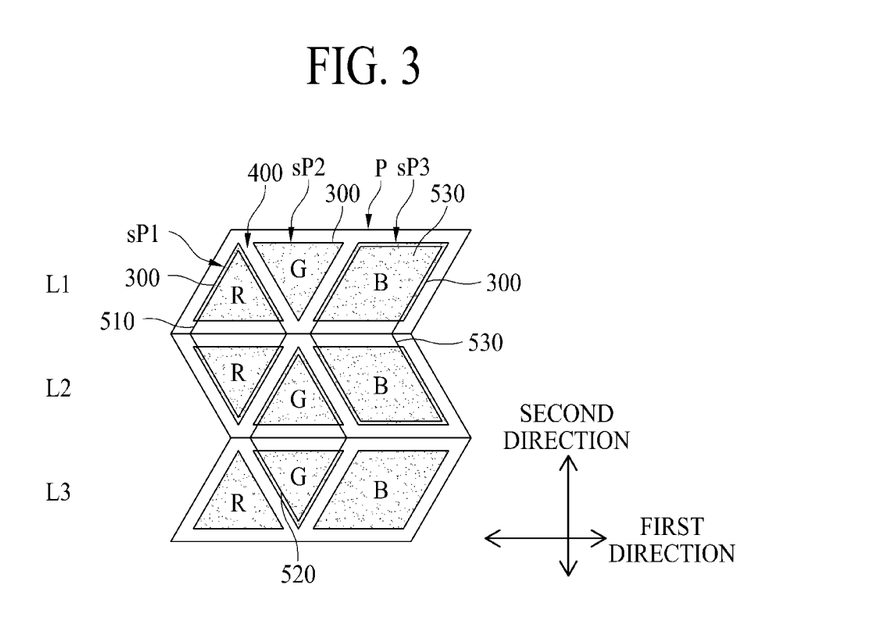
FIG. 3 is a plan view illustrating a structure of an emission layer in the electroluminescent display device according to one embodiment of the present invention.

FIG. 3 is a plan view illustrating a structure of an emission layer in the electroluminescent display device according to one embodiment of the present invention.

As shown in FIG. 3, the pixel (P) including the first sub pixel (sP1), the second sub pixel (sP2), and the third sub pixel (sP3) is provided in each of the plurality of rows (L1, L2, L3), and the bank layer 400 is provided along the boundaries between each of the sub pixels (sP1, sP2, sP3).

The structure in each of the first sub pixel (sP1), the second sub pixel (sP2), and the third sub pixel (sP3) is the same as that described above, whereby duplicative description for the same parts will be omitted.

Each of the first sub pixel (sP1), the second sub pixel (sP2), and the third sub pixel (sP3) is provided with a first electrode 300. The first electrode 300 provided in the first sub pixel (sP1) is formed in a structure corresponding to the structure of the first sub pixel (sP1), the first electrode 300 provided in the second sub pixel (sP2) is formed in a structure corresponding to the structure of the second sub pixel (sP2), and the first electrode 300 provided in the third sub pixel (sP3) is formed in a structure corresponding to the structure of the third sub pixel (sP3).

That is, the first electrode 300 provided in the first sub pixel (sP1) is formed in a triangle structure, the first electrode 300 provided in the second sub pixel (sP2) is formed in a triangle structure, and the first electrode 300 provided in the third sub pixel (sP3) is formed in a parallelogram structure.

Also, the first electrode 300 provided in the first sub pixel (sP1) of the second row (L2) is in a mirror-image relationship to the first electrode 300 provided in the first sub pixel (sP1) of the first row (L1), and to the first electrode 300 provided in the first sub pixel (sP1) of the third row (L3). Also, the first electrode 300 provided in the second sub pixel (sP2) of the second row (L2) is in an mirror-image relationship to the first electrode 300 provided in the second sub pixel (sP2) of the first row (L1), and to the first electrode 300 provided in the second sub pixel (sP2) of the third row (L3). Also, the first electrode 300 provided in the third sub pixel (sP3) of the second row (L2) is in an mirror-image relationship to the first electrode 300 provided in the third sub pixel (sP3) of the first row (L1), and to the first electrode 300 provided in the third sub pixel (sP3) of the third row (L3).

Also, emission layers MO, 520, and 530 are provided in the respective sub pixels (sP1, sP2, sP3). In detail, the first emission layer 510 is formed in the first sub pixel (sP1), the second emission layer 520 is formed in the second sub pixel (sP2), and the third emission layer 530 is formed in the third sub pixel (sP3).

In this case, the first emission layer 510 is provided to correspond to at least two of the first sub pixels (sP1), the second emission layer 520 is provided to correspond to at least two of the second sub pixels (sP2), and the third emission layer 530 is provided to correspond to at least two of the third sub pixels (sP3).

For example, the first emission layer 510 is provided to correspond to the two of first sub pixels (sP1) in the first row (L1) and the second row (L2), and the second emission layer 520 is provided to correspond to the two of second sub pixels (sP2) in the second row (L2) and the third row (L3). As the triangle structure of the first sub pixel (sP1) is opposite to the triangle structure of the second sub pixel (sP2), the pixel (P) including any one of the first sub pixel (sP1) which the first emission layer 510 corresponds to is in the first row (L1), however, the pixel (P) including any one of the second sub pixel (sP2) which the second emission layer 520 corresponds to is in the third row (L3). That is, some of the pixel (P) which the first emission layer 510 corresponds to is different from the pixel (P) which the second emission layer 520 corresponds to.

Also, the third emission layer 530 may be provided to correspond to the two of third sub pixels (sP3) in the first row (L1) and the second row (L2), but not limited to this structure.

According to one embodiment of the present invention, each of the emission layers 510, 520, and 530 is provided to correspond to at least two sub pixels (sP1, sP2, sP3) so that it is possible to form the emission layers 510, 520, and 530 in at least two sub pixels (sP1, sP2, sP3) at the same time by the use of one solution.

In this embodiment, the emission layers 510, 520, and 530 provided to correspond to at least two of the sub pixels (sP1, sP2, sP3) indicate that the emission layers for at least two of the sub pixels (sP1, sP2, sP3) are connected with each other and are formed as one body.

As described above, the first emission layer 510 may be provided to correspond to the first sub pixel (sP1) of the first row (L1) and the first sub pixel (sP1) of the second row (L2). In this case, one side of the first sub pixel (sP1) of the first row (L1) faces one side of the first sub pixel (sP1) of the second row (L2), whereby a sufficient empty space for spraying a solution so as to form the first emission layer 510 is prepared along the mutually-facing boundaries between the first sub pixel (sP1) of the first row (L1) and the first sub pixel (sP1) of the second row (L2). Thus, the first emission layer 510 may be mutually formed in both the first sub pixel (sP1) of the first row (L1) and the first sub pixel (sP1) of the second row (L2) by spraying the solution onto the mutually-facing boundaries between the first sub pixel (sP1) of the first row (L1) and the first sub pixel (sP1) of the second row (L2). Accordingly, the first emission layer 510 may be formed in a diamond-shaped structure obtained by combining the first sub pixel (sP1) of the first row (L1) and the first sub pixel (sP1) of the second row (L2) with each other.

In this embodiment, the emission layers 510, 520, and 530 spanning to subpixels in the second direction are formed in the diamond-shaped structure, but they are not limited to this structure. The emission layer 510, 520, and 530 may be formed in a shape allowing minute margins of error which might occur for a process of spraying the solution, or for a process of drying the solution.

Meanwhile, one vertex of the first sub pixel (sP1) of the second row (L2) faces one vertex of the first sub pixel (sP1) of the third row (L3) so that it is difficult to provide a sufficient space for spraying the solution so as to form the first emission layer 510 on the mutually-facing boundaries between the first sub pixel (sP1) of the second row (L2) and the first sub pixel (sP1) of the third row (L3). Thus, as described above, it is preferable that the solution for forming the first emission layer 510 is sprayed onto the mutually-facing boundaries between the first sub pixel (sP1) of the first row (L1) and the first sub pixel (sP1) of the second row (L2), preferably.

Similarly, a sufficient empty space for spraying a solution so as to form the second emission layer 520 is prepared along the mutually-facing boundaries between the second sub pixel (sP2) of the second row (L2) and the second sub pixel (sP2) of the third row (L3). Preferably, the solution for forming the second emission layer 520 is sprayed onto the mutually-facing boundaries between the second sub pixel (sP2) of the second row (L2) and the second sub pixel (sP2) of the third row (L3). Thus, the second emission layer 520 may be formed to correspond to both the second sub pixel (sP2) of the second row (L2) and the second sub pixel (sP2) of the third row (L3). Accordingly, the second emission layer 520 may be formed in a diamond-shaped structure obtained by combining the second sub pixel (sP2) of the second row (L2) and the second sub pixel (sP2) of the third row (L3) with each other.

The first sub pixel (sP1) and the second sub pixel (sP2) have the same size, whereby the first emission layer 510 and the second emission layer 520 may be formed in the same diamond-shaped structure.

Also, a sufficient empty space for spraying a solution so as to form the third emission layer 530 is prepared along the mutually-facing boundaries between the third sub pixel (sP3) of the first row (L1) and the third sub pixel (sP3) of the second row (L2). Preferably, the solution for forming the third emission layer 530 is sprayed onto the mutually-facing boundaries between the third sub pixel (sP3) of the first row (L1) and the third sub pixel (sP3) of the second row (L2). Thus, the third emission layer 530 may be formed to correspond to both the third sub pixel (sP3) of the first row (L1) and the third sub pixel (sP3) of the second row (L2). Accordingly, the third emission layer 530 may be formed in a structure including the two parallelogram shapes connected with each other, which is obtained by combining the third sub pixel (sP3) of the first row (L1) and the third sub pixel (sP3) of the second row (L2) with each other.

Meanwhile, a sufficient space for spraying the solution so as to form the third emission layer 530 is prepared on the boundaries between the third sub pixel (sP3) of the second row (L2) and the third sub pixel (sP3) of the third row (L3), whereby the third emission layer 530 may be provided to correspond to both the third sub pixel (sP3) of the second row (L2) and the third sub pixel (sP3) of the third row (L3).

The structure of the third emission layer 530 is different from the structure each of the first emission layer 510 and the second emission layer 520.

The first emission layer 510, the second emission layer 520, and the third emission layer 530 are spaced from one another. In detail, the bank layer 400 is provided between each of the first emission layer 510, the second emission layer 520, and the third emission layer 530, whereby the first emission layer 510, the second emission layer 520, and the third emission layer 530 are spaced from one another by the bank layer 400 provided in-between.

Meanwhile, although not shown in detail, a circuit device for driving the emission layer 510, 520, and 530 so as to emit light is provided in the plurality of sub pixels (sP1, sP2, sP3). The circuit device may include a switching thin film transistor, a driving thin film transistor, a sensing thin film transistor, and a capacitor, but not limited to this structure.

The circuit device may be disposed below each of the emission layers 510, 520, and 530. The circuit device may be disposed below the bank layer 400 provided between each of the emission layers 510, 520, and 530. For example, in case of a top emission type of the electroluminescent display device according to the embodiment of the present invention, even though the circuit device is disposed below each emission layer 510, 520, and 530, a light emission is not influenced by the circuit device, whereby the circuit device may be disposed below each emission layer 510, 520, and 530. In case of a bottom emission type of the electroluminescent display device according to the embodiment of the present invention, if the circuit device is disposed below each emission layer 510, 520, and 530, a light emission may be influenced by the circuit device, whereby the circuit device may be disposed below the bank layer 400.

According to one embodiment of the present invention, each emission layer 510, 520, and 530 is provided for at least two sub pixels (sP1, sP2, sP3). Thus, even though each of the sub pixels (sP1, sP2, sP3) is decreased in size, a size of the emission layer 510, 520, and 530 is not decreased. Thus, it is possible to form the emission layers 510, 520, and 530 without being mixed together by the use of inkjet apparatus, to thereby realize the high-resolution electroluminescent display device.

Figure 4:
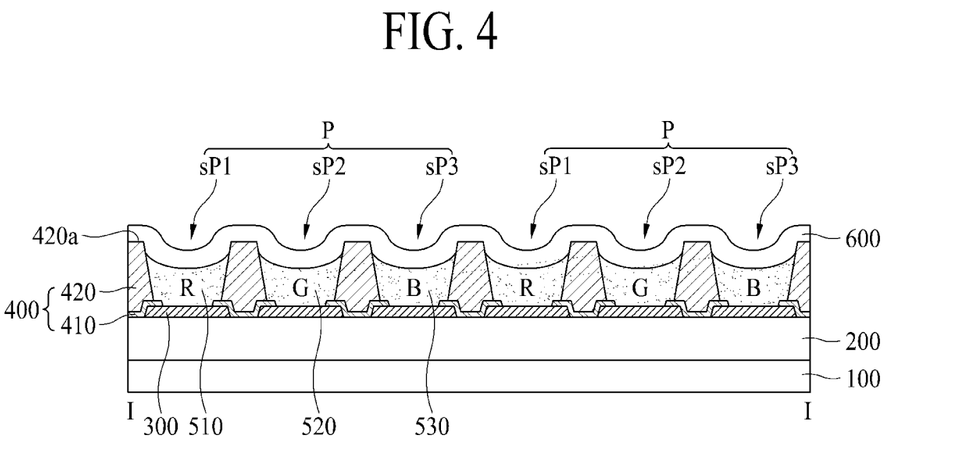
FIG. 4 is a cross sectional view illustrating the electroluminescent display device according to one embodiment of the present invention, which corresponds to a cross section along I-I line of FIG. 2.

FIG. 4 is a cross sectional view illustrating the electroluminescent display device according to one embodiment of the present invention, which corresponds to a cross sectional view along I-I line of FIG. 2.

As shown in FIG. 4, the electroluminescent display device according to one embodiment of the present invention may include a substrate 100, a circuit device layer 200, a first electrode 300, a bank layer 400, emission layers 510, 520, and 530, and a second electrode 600.

The substrate 100 may be formed of glass or transparent plastic, but not limited to these materials.

The circuit device layer 200 is provided on the substrate 100. The circuit device layer 200 may include a thin film transistor and a capacitor provided by each sub pixel (sP1, sP2, sP3). The thin film transistor may include a switching thin film transistor, a driving thin film transistor, and a sensing thin film transistor, as described above. A structure of the circuit device layer 200 may be changed in various types generally known to those in the art.

The first electrode 300 is provided on the circuit device layer 200. The first electrode 300 may function as an anode of the electroluminescent display device. If the electroluminescent display device according to the present invention is a bottom emission type, the first electrode 300 serves as a transparent electrode. Meanwhile, if the electroluminescent display device according to the present invention is a top emission type, the first electrode 300 serves as a reflective electrode.

The bank layer 400 covers an end of the first electrode 300, and the bank layer 400 is provided on the circuit device layer 200.

The bank layer 400 is provided along the boundaries between the adjoining pixels (P). Also, the bank layer 400 is provided along the boundaries between the adjoining sub pixels (sP1, sP2, sP3). Accordingly, it is possible to form an entire matrix configuration and to prepare a light-emission area in each of the sub pixels (sP1, sP2, sP3) by the use of bank layer 400.

The bank layer 400 may include a first bank layer 410 and a second bank layer 420.

The first bank layer 410 is in contact with the first electrode 300 and the circuit device layer 200. A thickness of the first bank layer 410 is smaller than a thickness of the second bank layer 420, and a width of the first bank layer 410 is larger than a width of the second bank layer 420. Accordingly, an end of the first bank layer 410 is in contact with the emission layers 510, 520, and 530. The first bank layer 410 with this structure has the same properties as those of the emission layers 510, 520, and 530, that is, hydrophilic properties. The first bank layer 410 having hydrophilic properties may be formed of an inorganic insulating material such as silicon oxide. Accordingly, when coating the solution for the emission layer 510, 520, and 530, the solution easily spreads on the first bank layer 410 so that the emission layer 510, 520, and 530 spreads widely to the end in each sub pixel (sP1, sP2, sP3).

The second bank layer 420 is patterned on the first bank layer 410.

The width of the second bank layer 420 is smaller than the width of the first bank layer 410. The second bank layer 420 may be patterned by a sequential process of coating a mixture solution obtained by mixing an organic insulating material having hydrophilic properties with hydrophobic material such as fluorine (F), and carrying out a photolithography process. By light irradiated for the photolithography process, hydrophobic material such as fluorine (F) is transferred to an upper portion 420a of the second bank layer 420, whereby the upper portion 420a of the second bank layer 420 has hydrophobic properties, and the other portions of the second bank layer 420 except the upper portion 420a have hydrophilic properties. That is, the portion of the second bank layer 420 being in contact with the first bank layer 410 has hydrophilic properties, and the upper portion 420a of the second bank layer 420 has hydrophobic properties, but not limited to these structures. For example, the entire portions of the second bank layer 420 may have hydrophobic properties.

The spreadability of the solution for the emission layers 510, 520, and 530 may be improved by the first bank layer 410 and the predetermined portions of the second bank layer 420 which have the hydrophilic properties. Especially, as the first bank layer 410 whose thickness is smaller than that of the second bank layer 420 is provided widely, it is possible to prepare a two-step structure having hydrophilic properties by a combination of the first bank layer 410 and the second bank layer 420. Thus, the solution for the emission layers 510, 520, and 530 easily spreads to the end area of each sub pixel (sP1, sP2, sP3) such that it is possible to prevent the emission layers 510, 520, and 530 from being upwardly rolled at the end area of each sub pixel (sP1, sP2, sP3) due to the large thickness.

Also, the upper portion 420a of the second bank layer 420, which has the hydrophobic properties, prevents the solution for the emission layers 510, 520, and 530 from spreading to the adjoining sub pixels (sP1, sP2, sP3) such that it is possible to prevent the emission layers 510, 520, and 530 from being mixed together.

The emission layers 510, 520, and 530 are provided on the first electrode 300. The emission layers 510, 520, and 530 include the first emission layer 510 provided in the first sub pixel (sP1), the second emission layer 520 provided in the second sub pixel (sP2), and the third emission layer 530 provided in the third sub pixel (sP3).

The first emission layer 510 emits red light (R), the second emission layer 520 emits green light (G), and the third emission layer 530 emits blue light (B), but not limited to these structures.

Each of the first emission layer 510, the second emission layer 520, and the third emission layer 530 may be formed by a solution process using an inkjet apparatus.

Each of the first emission layer 510, the second emission layer 520, and the third emission layer 530 formed by the solution process may include one or more organic layers among a hole injecting layer, a hole transporting layer, an emitting layer, an electron transporting layer, and an electron injecting layer. If needed, each of the first emission layer 510, the second emission layer 520, and the third emission layer 530 may include inorganic material such as quantum dot.

For example, each of the first emission layer 510, the second emission layer 520, and the third emission layer 530 may be formed in a sequential deposition structure of the hole injecting layer, the hole transporting layer, the emitting layer, the electron transporting layer, and the electron injecting layer.

If needed, each of the first emission layer 510, the second emission layer 520, and the third emission layer 530 may be formed in a sequential deposition structure of the hole injecting layer, the hole transporting layer, and the emitting layer. In this case, the electron transporting layer and the electron injecting layer may be additionally deposited on each of the first emission layer 510, the second emission layer 520, and the third emission layer 530 by a deposition process such as evaporation. Although not shown, the electron transporting layer and the electron injecting layer, which are provided by the deposition process, are not individually patterned by each of the first sub pixel (sP1), the second sub pixel (sP2), and the third sub pixel (sP3), and the electron transporting layer and the electron injecting layer are provided not only on the first emission layer 510, the second emission layer 520, and the third emission layer 530 but also on the bank layer 400.

The second electrode 600 is provided on the emission layers 510, 520, and 530 and the bank layer 400. The second electrode 600 serves as a cathode of the electroluminescent display device. If the electroluminescent display device according to the present invention is a top emission type, the second electrode 600 serves as a transparent electrode. Meanwhile, if the electroluminescent display device according to the present invention is a bottom emission type, the second electrode 600 serves as a reflective electrode.

Figure 5:
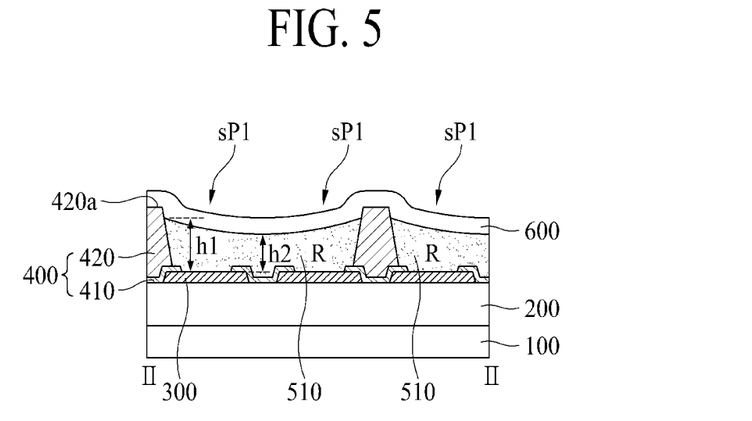
FIG. 5 is a cross sectional view illustrating the electroluminescent display device according to one embodiment of the present invention, which corresponds to a cross section along II-II line of FIG. 2.

FIG. 5 is a cross sectional view illustrating the electroluminescent display device according to one embodiment of the present invention, which corresponds to a cross sectional view along II-II line of FIG. 2.

Except a bank layer 400 and emission layers 510 and 530, other elements are the same as those of the aforementioned description.

In the same manner as the aforementioned description, the bank layer 400 may include a first bank layer 410 and a second bank layer 420.

The first bank layer 410 is provided along the boundaries between the adjoining first sub pixels (sP1). That is, the first bank layer 410 is provided along the boundaries between the first sub pixel (sP1) of any one pixel (P) and the first sub pixel (sP1) of the adjoining pixel (P).

The second bank layer 420 is provided on the first bank layer 410. In this case, the second bank layer 420 is not formed along the boundaries between the two of the first sub pixels (sP1) which adjoin each other and share the first emission layer 510, but formed along the boundaries between the two of the first sub pixel (sP1) which adjoin each other and do not share the first emission layer 510.

Accordingly, some of the plurality of first bank layers 410 formed along the boundaries between the two of the first sub pixel (sP1) are provided below the second bank layer 420, and the remaining ones of the first bank layers 410 are not provided below the second bank layer 420. If the first bank layer 410 is not provided below the second bank layer 420, then the entire upper surface of the first bank layer 410 is in contact with the first emission layer 510.

Each of the plurality of first emission layers 510 is provided to correspond to the adjoining two of the first sub pixels (sP1), and the plurality of first emission layers 510 provided to correspond to the adjoining two of the first sub pixels (sP1) are spaced from each other by the second bank layer 420, but not limited to this structure. The first emission layer 510 may be provided to correspond to the adjoining three or more of the first sub pixels (sP1).

One end of the first emission layer 510 provided in any one of the first sub pixel (sP1) is in contact with the second bank layer 420, and the other end of the first emission layer 510 provided in any one of the first sub pixel (sP1) is in contact with the first emission layer 510 provided in the adjoining first sub pixel (sP1). For this reason, a thickness (h1) of one end of the first emission layer 510 is larger than a thickness (h2) of the other end of the first emission layer 510 between the adjoining two first sub pixels (sP1).

That is, if forming the first emission layer 510 by solution coating and drying processes, the thickness (h1) of one end of the first emission layer 510 being in contact with the second bank layer 420 functioning as a spreading prevention wall is larger than the thickness (h2) of the other end of the first emission layer 510 in the first sub pixel (sP1).

According to the embodiment of the present invention, an emission layer may be provided for at least two of the sub pixels. Thus, even though the sub pixel is decreased in size, the area of the emission layer is not decreased in size. As a result, it is possible to form the emission layers without being mixed together by the use of inkjet apparatus, thereby realizing the high-resolution electroluminescent display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electroluminescent display device comprising:
    a substrate;
    a plurality of pixels arranged in a first direction and a second direction intersecting the first direction on the substrate;
    a circuit device layer;
    a first electrode;
    a second electrode;
    a bank layer having a first part and a second part;
    a first sub pixel, a second sub pixel, and a third sub pixel provided in each of the plurality of pixels and arranged in the first direction;
    a first emission layer that is continuous and overlapping at least two first sub pixels arranged in the second direction;
    a second emission layer that is continuous and overlapping at least two second sub pixels arranged in the second direction; and
    a third emission layer that is continuous and overlapping at least two third sub pixels arranged in the second direction,
    wherein each of the first emission layer, the second emission layer, and the third emission layer is spaced from apart from one another and emits different color of light, and
    wherein a thickness of one end of the first emission layer having a first portion being in contact with the second part of the bank layer functioning as a spreading prevention wall is larger than a thickness of a second portion of the first emission layer in the first sub pixel that is not in contact with the second part of the bank layer.

2. The electroluminescent display device according to claim 1, wherein, among the plurality of pixels, the pixel including the first sub pixel which the first emission layer corresponds to is different from the pixel including the second sub pixel which the second emission layer corresponds to.

3. The electroluminescent display device according to claim 1, wherein each of the first sub pixel and the second sub pixel is formed in a triangle structure.

4. The electroluminescent display device according to claim 3, wherein each of the two of the first sub pixels which the first emission layer corresponds to has a respective side facing each other.

5. The electroluminescent display device according to claim 3,
wherein one side of the triangle structure of the first sub pixel is adjacent to a lower side of one pixel, and one vertex opposite to the one side of the triangle structure of the first sub pixel is adjacent to an upper side of the one pixel, and
wherein one side of the triangle structure of the second sub pixel is adjacent to the upper side of the one pixel, and one vertex opposite to the one side of the triangle structure of the second sub pixel is adjacent to the lower side of the one pixel.

6. The electroluminescent display device according to claim 3, wherein each of the first emission layer and the second emission layer comprises a diamond structure.

7. The electroluminescent display device according to claim 3, wherein each of the third sub pixel and the pixel comprises a parallelogram structure.

8. The electroluminescent display device according to claim 3, wherein the first emission layer and the second emission layer are disposed as a staggered manner in a plan view of the electroluminescent display device.

9. The electroluminescent display device according to claim 1, wherein the bank layer is provided along boundaries of each of the first sub pixel, the second sub pixel, and the third sub pixel, the bank layer separating the first sub pixel, the second sub pixel, and the third sub pixel from one another,
wherein the first part has hydrophilic properties, and the second part has an upper surface having hydrophobic properties, the second part on the first part.

10. The electroluminescent display device according to claim 1, wherein the first part has hydrophilic properties provided along boundaries between at least two of first sub pixels to which the first emission layer corresponds, boundaries between at least two of second sub pixels to which the second emission layer corresponds, and boundaries between at least two of third sub pixels to which the third emission layer corresponds,
wherein an upper surface of the first part is in contact with the first emission layer, the second emission layer, and the third emission layer.

11. The electroluminescent display device according to claim 1, wherein the first part and the second part are configured to be one body.

12. The electroluminescent display device according to claim 1, wherein the first part is disposed at a lower part of the bank and the second part is disposed at an upper part of the bank.

13. The electroluminescent display device according to claim 12, wherein the second part is linear.

14. The electroluminescent display device according to claim 1, wherein the second electrode is continuous on the emission layers of the first sub pixel, the second sub pixel, and the third sub pixel.

15. The electroluminescent display device according to claim 1, wherein the first sub pixel and the second sub pixel are adjacent to each other and have a first shape, and the third sub pixel is adjacent to the second sub pixel with the second sub pixel between the first sub pixel and the third sub pixel and has a second shape that is different from the first shape of the first sub pixel and the second sub pixel.

16. An electroluminescent display device, comprising:
a substrate;
a plurality of first electrodes arranged in a first direction and a second direction intersecting the first direction, each of the plurality of first electrodes overlapping with a corresponding subpixel of a pixel among a plurality of pixels of the electroluminescent display device, on the substrate;
a plurality of emission layers, one or more of the plurality of emission layers continuous and overlapping two or more subpixels of different pixels in the second direction of the electroluminescent display device;
a bank layer having a first part and a second part; and
a second electrode corresponding to the two or more subpixels of the different pixels of the electroluminescent display device,
wherein a thickness of one end of the one or more of the plurality of emission layers having a first portion being in contact with the second part functioning as a spreading prevention wall is larger than a thickness of a second portion of the one or more of the plurality of emission layers in the subpixel that is not in contact with the second part.

17. The electroluminescent display device of claim 16, wherein the one or more of the plurality of emission layers include:
a first emission layer configured to emit light of a first color and having a first shape; and
a second emission layer configured to emit light of a second color and having a second shape.

18. The electroluminescent display device of claim 17, wherein the one or more of the plurality of emission layers include a third emission layer configured to emit light of a third color and having the first shape.

19. The electroluminescent display device of claim 16, wherein:
the pixels of the electroluminescent display device include a first pixel, a second pixel, and a third pixel arranged in the second direction;
the first pixel includes a first subpixel, a second subpixel, and a third subpixel arranged in the first direction within the first pixel;
the second pixel includes a first subpixel, a second subpixel, and a third subpixel arranged in the first direction within the second pixel;
the third pixel includes a first subpixel, a second subpixel, and a third subpixel arranged in the first direction within the third pixel;
a first emission layer is configured to emit light of a first color, is continuous and overlaps the first subpixel of the first pixel and the first subpixel of the second pixel;
a second emission layer is configured to emit light of a second color, is continuous and overlaps the second subpixel of the second pixel and the second subpixel of the third pixel; and
a third emission layer is configured to emit light of a third color, is continuous and overlaps the third subpixel of the first pixel and the third subpixel of the second pixel.

20. The electroluminescent display device of claim 19, wherein:
the first subpixel of the first pixel has a first triangle shape and the first subpixel of the second pixel has a second triangle shape mirroring the first triangle shape along a boundary between the first subpixel of the first pixel and the first subpixel of the second pixel, the first emission layer having a diamond shape;
the second subpixel of the second pixel has the first triangle shape and the second subpixel of the third pixel has the second triangle shape mirroring the first triangle shape along a boundary between the second subpixel of the second pixel and the second subpixel of the third pixel, the second emission layer having the diamond shape; and the third subpixel of the first pixel has a first parallelogram shape and the third subpixel of the second pixel has a second parallelogram shape mirroring the first parallelogram shape along a boundary between the third subpixel of the first pixel and the third subpixel of the second pixel, the third emission layer having a joined parallelogram shape joining the first parallelogram shape and the second parallelogram shape.

21. The electroluminescent display device of claim 16, wherein the first part has hydrophilic properties and the second part with an upper surface has hydrophobic properties, the second part disposed on the first part, the first part separating the first electrodes of each of the subpixels from one another, and the second part separating each of the emission layers from one another.

22. The electroluminescent display device according to claim 16, wherein the first emission layer and the second emission layer are disposed as a staggered manner in a plan view of the electroluminescent display device.

23. The electroluminescent display device according to claim 16, wherein the first part and the second part are configured to be one body.

24. The electroluminescent display device according to claim 16, wherein the first part is disposed at a lower part of the bank and the second part is disposed at an upper part of the bank.

25. The electroluminescent display device according to claim 16, wherein the second part is linear.

* * * * *